(12) United States Patent
Bittner et al.

(10) Patent No.: US 11,259,448 B2
(45) Date of Patent: Feb. 22, 2022

(54) POWER ELECTRONICS SYSTEM HAVING A HOUSING, A COOLING DEVICE, A POWER SEMICONDUCTOR MODULE AND A CAPACITOR DEVICE

(71) Applicant: SEMIKRON ELEKTRONIK GMBH & CO. KG, Nuremberg (DE)

(72) Inventors: Roland Bittner, Stegaurach (DE); Sandro Bulovic, Langenzenn (DE); Johannes Klier, Amberg (DE)

(73) Assignee: SEMIKRON ELEKTRONIK GmbH & Co. KG, Nuremberg (DE)

(*) Notice: Subject to any disclaimer, the term of this patent is extended or adjusted under 35 U.S.C. 154(b) by 0 days.

(21) Appl. No.: 16/952,445

(22) Filed: Nov. 19, 2020

(65) Prior Publication Data

US 2021/0204442 A1 Jul. 1, 2021

(51) Int. Cl.
*H05K 7/20* (2006.01)
*H01G 2/08* (2006.01)
*H01G 4/236* (2006.01)
*H01L 23/473* (2006.01)

(52) U.S. Cl.
CPC ........... *H05K 7/20927* (2013.01); *H01G 2/08* (2013.01); *H05K 7/209* (2013.01); *H05K 7/2039* (2013.01); *H05K 7/20218* (2013.01); *H01G 4/236* (2013.01); *H01L 23/473* (2013.01)

(58) Field of Classification Search
CPC .. H05K 7/209; H05K 7/2039; H05K 7/20927; H05K 7/20218; H01G 2/08; H01G 4/236
See application file for complete search history.

(56) References Cited

U.S. PATENT DOCUMENTS

| 8,780,557 | B2 * | 7/2014 | Duppong | H05K 7/209 361/699 |
| 9,907,215 | B2 * | 2/2018 | Backhaus | H01L 23/3675 |
| 2020/0328027 | A1 * | 10/2020 | Nguyen | H01G 4/38 |
| 2021/0185851 | A1 * | 6/2021 | Bulovic | H01G 4/40 |

FOREIGN PATENT DOCUMENTS

DE 102015113873 B3 7/2016

* cited by examiner

*Primary Examiner* — Zachary Pape
(74) *Attorney, Agent, or Firm* — Andrew F. Young, ESQ.; Nolte Lackenbach Siegel

(57) ABSTRACT

A power electronics system has a housing, a cooling device, a power semiconductor module and a capacitor device, wherein a cooling section of a capacitor connection device is in thermally conducting contact with a cooling surface of the cooling device.

8 Claims, 5 Drawing Sheets

POWER ELECTRONICS SYSTEM HAVING A HOUSING, A COOLING DEVICE, A POWER SEMICONDUCTOR MODULE AND A CAPACITOR DEVICE

CROSS REFERENCE TO RELATED APPLICATIONS

This application relates to and claims priority to DE 10 2019 134 650.9 filed on Dec. 17, 2019, the entire contents of which are incorporated herein by reference.

FIGURE SELECTED FOR PUBLICATION

FIG. 4

BACKGROUND OF THE INVENTION

Field of the Invention

The invention relates to a power electronics system having a housing, a cooling device, a power semiconductor module and a capacitor device and at least one capacitor connection device which electrically connects the capacitor device to the power semiconductor module.

Description of the Related Art

DE 10 2015 113 873 B3 discloses as prior art a power electronics module, which is designed with a housing and a capacitor device arranged within it, wherein the housing has a cooling surface arranged inside which is designed to be cooled by means of a cooling device that is either integrated in the housing or arranged externally, and wherein the capacitor device has a capacitor with a contact device for a first and a second polarity, and a capacitor busbar. This capacitor busbar has a first flat metallic shaped body and a second flat metallic shaped body, wherein the first flat metallic shaped body is electrically conductively connected to the first contact device of the first polarity and the second flat metallic shaped body is electrically conductively connected to the second contact device of the second polarity. Furthermore, a first section of the first metallic shaped body has a first subsection, arranged parallel to and spaced apart from the cooling surface, and a second subsection, which is in thermal contact with the cooling surface, wherein both subsections are connected to each other by an intermediate section.

ASPECTS AND SUMMARY OF THE INVENTION

The object of the invention is to improve the cooling of the relevant components of a power electronics system.

This object is achieved according to the invention by a power electronics system having a housing, a cooling device, a power semiconductor module and a capacitor device, wherein a cooling section of a capacitor connection device is in thermally conducting contact with a cooling surface of the cooling device.

It can be advantageous if the cooling device is an integral part of the housing or is arranged in the housing. The term 'integral part of the housing' is understood to mean that the housing as such contributes significantly to the cooling of the components of the power electronics system. This term does not refer to connecting elements for a cooling device arranged inside the housing.

It is particularly preferable if the cooling surface is arranged on a pedestal or in a recess.

It can be advantageous if the cooling section is designed fan-shaped, or finger-shaped, or as a mixed form of these.

It is preferable if each capacitor connection device is designed as two flat metallic shaped bodies with one contact device each, and each having a connecting section between the capacitor device and the contact device. In this case, the connecting sections of one of the capacitor connection devices can be arranged in stacks and run parallel to each other, and an insulating material, preferably an insulating foil, can be arranged between the connecting sections.

In addition, it can be advantageous if the profile of the connecting section has a slanted portion, preferably a plurality of slanted portions.

It is particularly advantageous if the cooling section is designed as a cooling extension, for example as a nose-shaped cooling extension, which is an integral part of the connecting section and does not contribute to the current-carrying capacity of the capacitor connection device. In this case, the cooling section does not lie directly in the current flow direction. This can be implemented by a first configuration wherein the cooling extension protrudes laterally from the connecting section. Alternatively, this can be implemented by a second configuration wherein in the region of a slanted portion the cooling extension is designed as an unslanted portion of the connecting section.

It can be preferable if the cooling section is arranged in the region of a U-shaped folded section of the connecting section. In this case, it is particularly advantageous if the connecting sections of one of the capacitor connection devices are arranged in stacks and the connecting section arranged adjacent to the cooling surface is cooled by means of the U-shaped section and the other connecting section is cooled by means of a cooling extension.

The cooling device can be designed as a liquid cooling device with an inlet and an outlet device, or as an air cooling device.

Of course, provided that this is not inherently or explicitly excluded, the features mentioned in the singular, in particular the power converter module, may also be present in a plurality in the system according to the invention.

It goes without saying that the various embodiments of the invention can be implemented either individually or in any combination, in order to achieve improvements. In particular, the above features and those mentioned below can be applied not only in the specified combinations, but also in other combinations or in isolation, without departing from the scope of the present invention.

Further explanations of the invention, advantageous details and features are derived from the following description of the exemplary embodiments of the invention shown schematically in the figures or from relevant parts thereof.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1A:
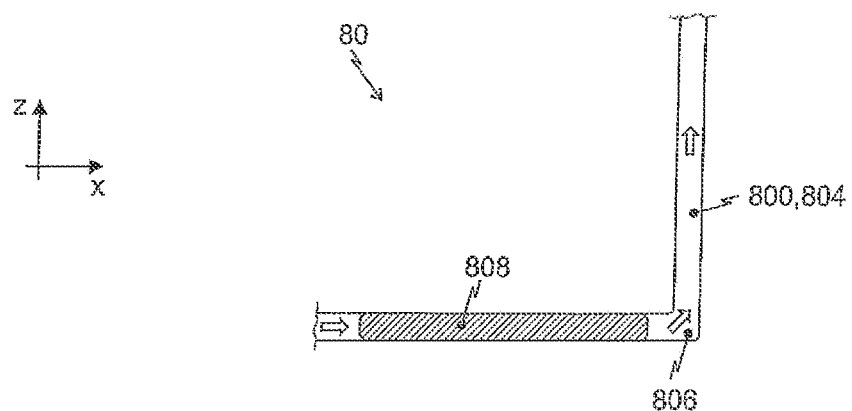
FIGS. 1A, 1B, and 1C show views of a first design of a capacitor connection device.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Figure 1B:
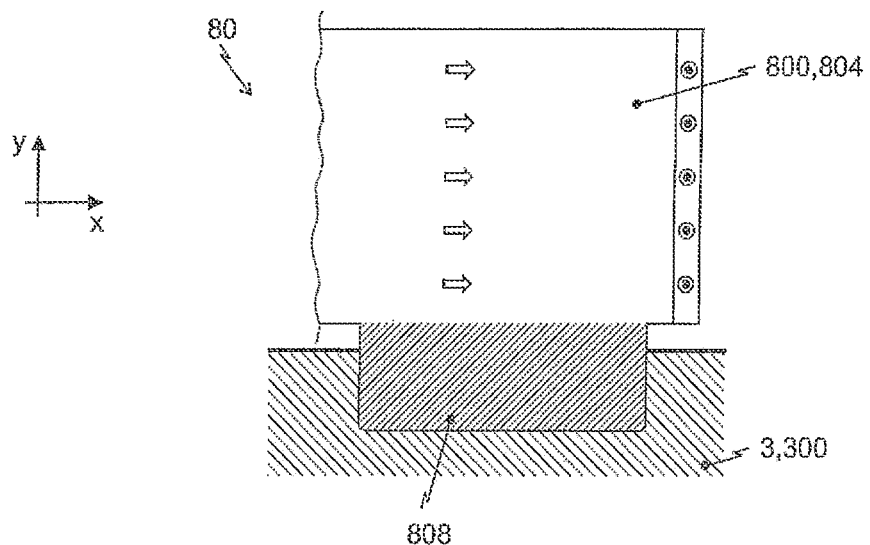

FIGS. 1A and 1B show views of a first design, as well as an alternative embodiment, of a capacitor connection device 80. A part of a capacitor connection device 80 is illustrated, namely a section of a metallic shaped body 800 with a slanted portion 806. The direction of current flow within the connecting section 804, either away from a capacitor device or toward a capacitor device, is indicated by arrows. A cooling section 808 is formed in a section of the metallic shaped body 800, which is formed as a cooling section 808 protruding perpendicular to the current flow direction, i.e. as a cooling extension.

Obviously, this cooling section 808 does not contribute to the current-carrying capacity of the capacitor connection device 80, since it only increases the cross-sectional area of the metallic shaped body 800 locally and in addition is not arranged in the direction of current flow.

Also shown is a cooling surface 300 of a cooling device 3. The cooling section 808 rests completely on or, as shown here, on at least a substantial part of this cooling surface 300. A substantial part is deemed to be when at least 80% of the surface resulting from the projection of the cooling section rests on the assigned cooling surface.

Figure 1C:
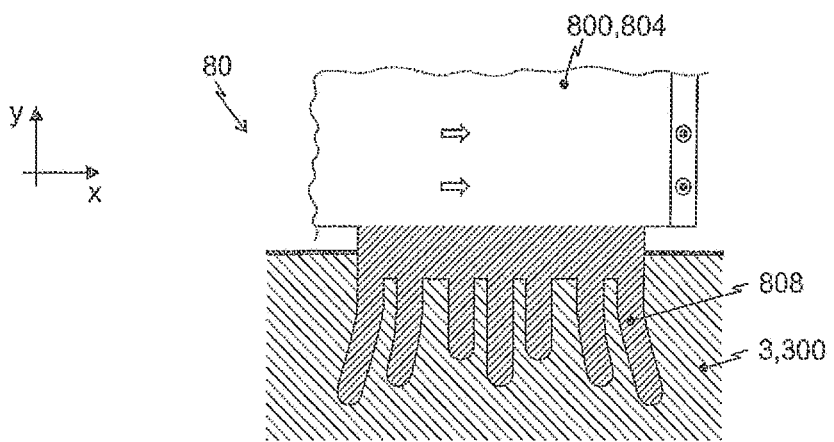

In partial FIGS. 1A and 1B, the cooling section 808 of the metallic shaped body 800 of the connecting section 804 is substantially cuboid-shaped, whereas in partial FIG. 1C the cooling section 808 takes the form of fingers spread out in a fan-like manner.

Figure 2A:
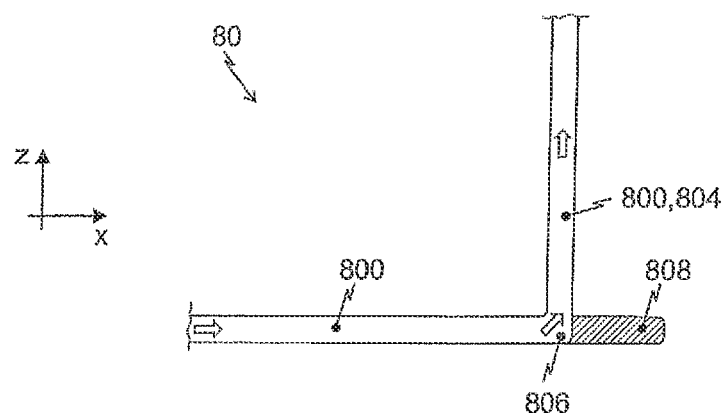
FIGS. 2A, 2B, and 2C shows two views of a second design of a capacitor connection device.
Figure 2B:
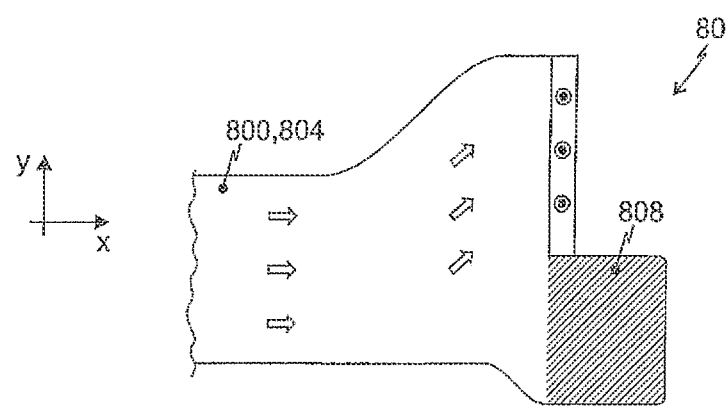

FIGS. 2A and 2B shows two views of a second design, as well as an alternative embodiment, of a capacitor connection device 80. Again, a part of a capacitor connection device 80 is represented, namely a section of a metallic shaped body 800 of the connecting section 804 with a slanted portion 806. The direction of current flow, either away from a capacitor device or toward a capacitor device, is indicated by arrows. A cooling section 808 is formed in a section of the metallic shaped body 800, which is formed as a nose-shaped cooling extension in the region of a slanted portion 806 as an unslanted part of the connecting section 804. Here, the cooling section 808 extends the surface of the first section further, while the second section of the metallic shaped body 800 contributing to the current-carrying capacity extends past the slanted portion in a different direction, here perpendicular to the first.

Obviously, this cooling section 808 does not contribute to the current-carrying capacity of the capacitor connection device 80, since it is not arranged in the direction of current flow.

Figure 2C:
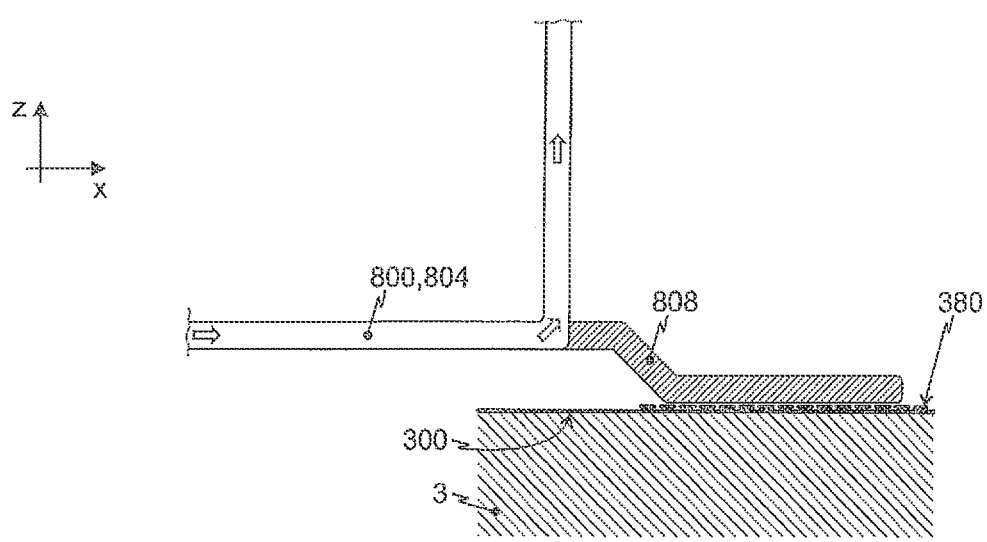

In partial FIGS. 2A and 2B, the cooling section 808 is substantially cuboidal and planar in shape, while in partial FIG. 2C the cooling section 808 has a Z-shaped slanted section. The cooling section 808 of this design is resting directly on an assigned cooling surface 300 of a cooling device 3 in a planar manner. In each case, the term "resting directly" means that only one insulating material body 380, in particular of a ceramic or plastic foil, is arranged between the cooling surface 300 and the cooling section 808. The cooling section 808 is therefore directly connected to the cooling device 3 in a thermally conducting manner.

Figure 3:
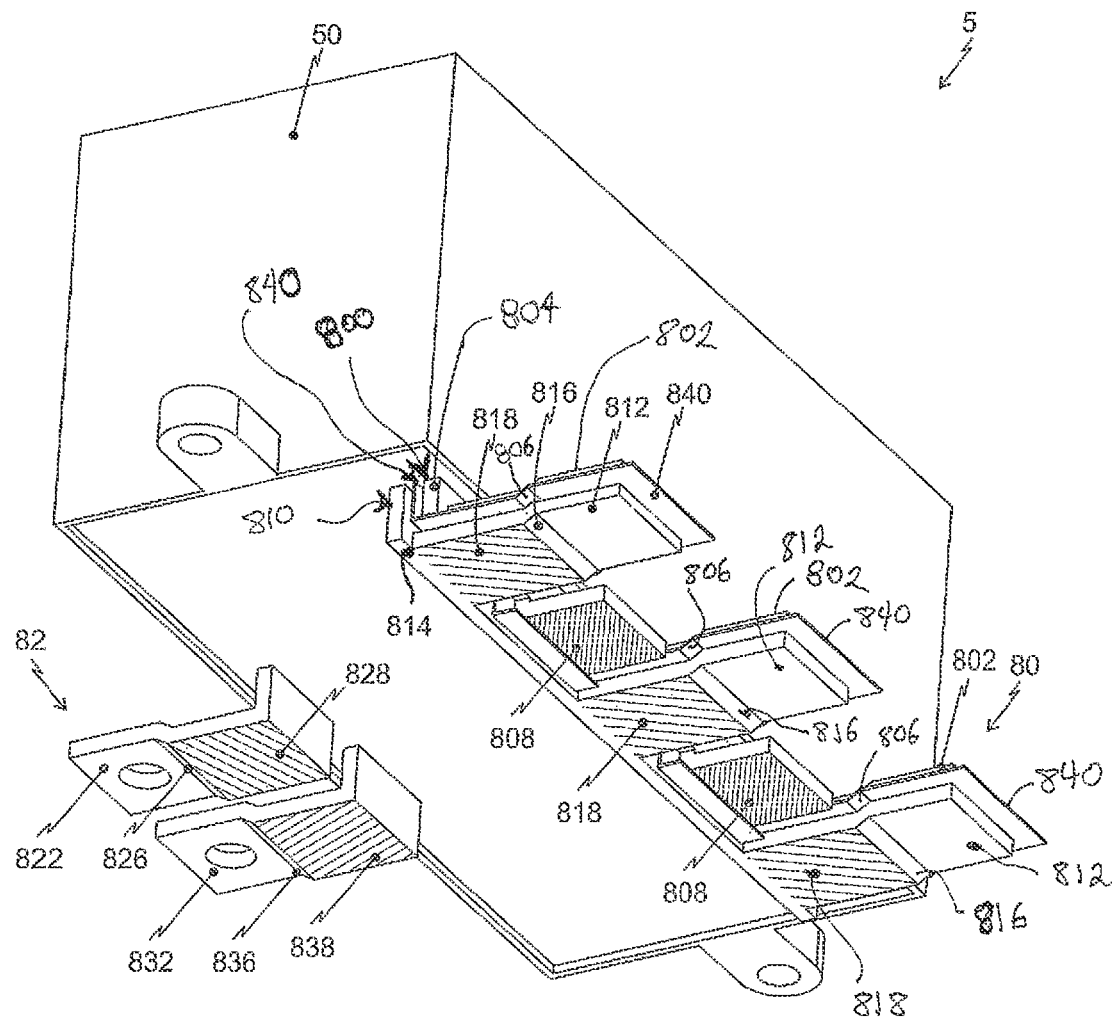
FIG. 3 shows a capacitor device of a power electronics system according to the invention.

FIG. 3 shows a capacitor device 5 of a power electronics system according to the invention. This capacitor device 5 comprises a capacitor housing 50 and two capacitor connection devices 80,82. The first capacitor connection device 80 provides the connection to a power semiconductor module (see FIGS. 4 and 5) and has two flat metallic shaped bodies 800,810, which are assigned a first and a second polarity. An insulating foil 840 for the electrical insulation of the metallic shaped bodies from each other is arranged between these metallic shaped bodies 800,810.

Each of the metallic shaped bodies 800,810 has three contact devices 802,812, in this case pressure contact devices, which are each intended to be connected to the DC connecting elements of each of the three phases of the power semiconductor module.

The two metallic shaped bodies 800,810 additionally have a plurality of slanted portions 806,816 over their course from the capacitor device 5 to the contact devices 802,812, which are used to position the contact devices 802,812 such that they fit the power semiconductor module.

Figure 4:
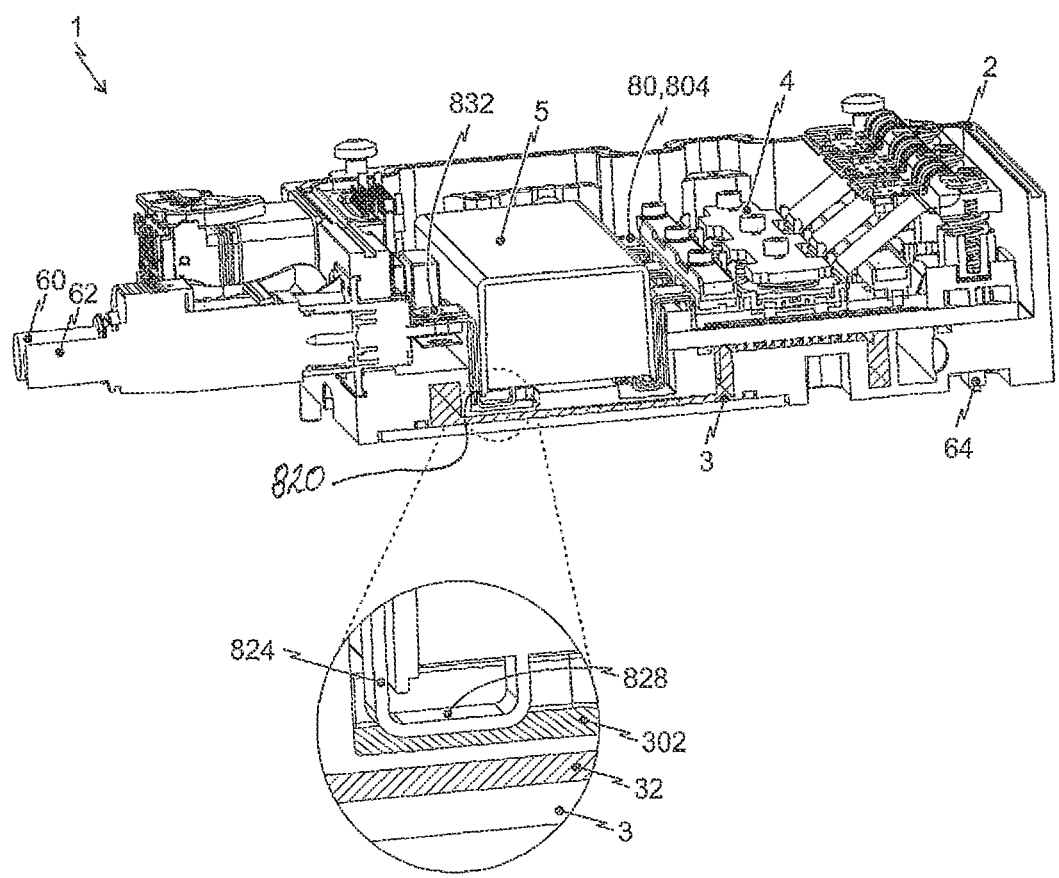
FIGS. 4 and 5 show various three-dimensional views of a power electronics system according to the invention.*
Figure 5:
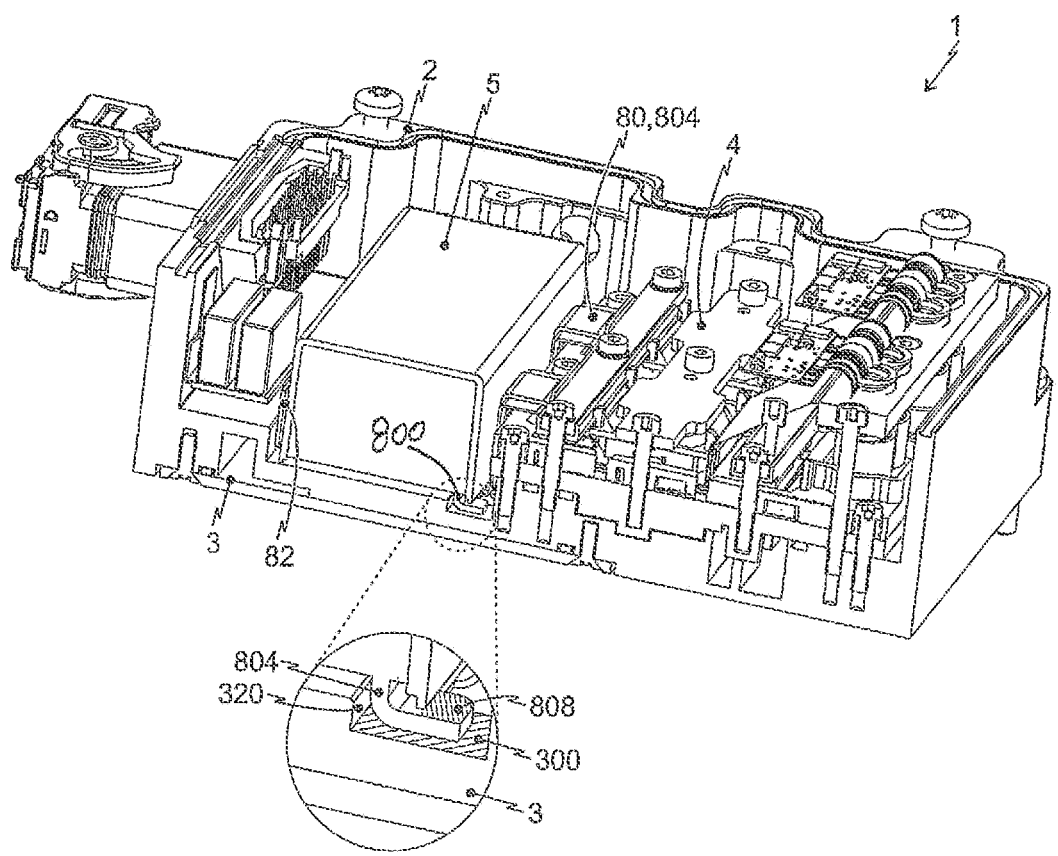

The first and second metallic shaped bodies 800,810 of the first capacitor connection device 80 form a stack, wherein sections of the second metallic shaped body 810, each running parallel to a cooling surface 300, cf. FIGS. 4 and 5, of a cooling device, are arranged between the respective section of the first metallic shaped body 800 and the cooling surface 300.

The first metallic shaped body 800 of the first capacitor connection device 80 has two additional cooling sections 808, which are essentially designed in the same way as those according to FIGS. 2a and 2b. These flat cooling sections 808 thus form cooling extensions that do not contribute to the current flow and thus to the current-carrying capacity of the first metallic shaped 800. In the region of one of the slanted portions 806 the cooling sections 808 are formed as an unslanted region of the first metallic shaped body 800, cf. FIG. 2. They are thus an integral part of the metallic shaped body 800, since they are formed in one piece with it.

The second metallic shaped body 810 of the first capacitor connection device 80 has three cooling sections 818, which are arranged in the direction of current flow and thus contribute to the current-carrying capacity of this second metallic shaped 810. These cooling sections 818 are formed in the region of U-shaped folded sections of the metallic shaped body 810, as the foot section of this U-shaped folded section.

Thus, the second metallic shaped body 810, or connecting section 814, of the capacitor connection device 5, which is arranged in a section of its course directly adjacent to a cooling surface 300, has a cooling section 808, which contributes to the current-carrying capacity of the metallic shaped 810, while the first metallic shaped body 800, or connecting section 804, of the capacitor connection device 80, which is arranged in the assigned parallel section of its course indirectly adjacent to the cooling surface 300, has a cooling section 808 in the form of a cooling extension, which does not contribute to the current-carrying capacity of the metallic shaped 800.

The second capacitor connection device 82 is used for connecting the capacitor device to an external connecting element (see FIGS. 4 and 5) of the power electronics system and therefore to provide its DC current supply, and has two flat metallic shaped bodies 820, 830, which are assigned in turn to a first and a second polarity.

Both metallic shaped bodies 820, 830 of the second capacitor connection device 82 each have cooling sections 828, 838 arranged directly on the capacitor device 5, which are each arranged in a U-shaped folded section of the connecting section 824, 834. The foot section of the respective U-shaped folded sections is in direct thermally conducting contact with an assigned cooling surface 302 of a cooling device 3, see FIGS. 4 and 5.

FIGS. 4 and 5 show two different three-dimensional views of a power electronics system 1 according to the invention. This cross-sectional view shows the housing 2 of the power electronics system 1, which in this case, without restriction of generality, simultaneously forms the cooling device 3, here a liquid cooling device, with a plurality of cooling cavities 32. A power semiconductor module 4 and a capacitor device 5 are arranged in the housing 2. The housing 2 has additional components, such as DC load 60, 62 and AC load connecting elements 64, among others.

The cooling device 3 has a plurality of cooling surfaces 300,302. The power semiconductor module 4 is arranged on one of these cooling surfaces, and connected to the cooling device 3 in a thermally conducting manner. The power semiconductor module 4 is designed in particular to generate a three-phase output DC current from an input DC current, which is used in particular to drive a motor in an electric vehicle.

As described in relation to FIG. 3, the capacitor device 5 comprises a capacitor housing 50 and two capacitor connection devices 80, 82. These capacitor connection devices 80, 82 are described in detail under FIG. 3.

FIG. 4 explicitly shows the connection of the cooling section 828 of the connecting section 824 of a metallic shaped body 820 of the second capacitor connecting device 82. This cooling section 828 is located in a recess of the cooling device in direct thermally conducting contact with the latter. In this case, the cooling section 828 is arranged in the region of a U-shaped folded section of the connecting section 824.

FIG. 5 explicitly shows the connection of the cooling section 808, or of the cooling flow, of the first connecting section 804 of the first metallic shaped body 800 of the first capacitor connection device 80. This cooling extension is located in a recess 320 of the cooling device 3 in direct thermally conducting contact with the latter.

It is to be noted that of course features of different exemplary embodiments of the invention can be combined with one another in an arbitrary manner, unless the features are mutually exclusive, without departing from the scope of the invention.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics system having a housing, a cooling device, a power semiconductor module and a capacitor device, further comprising:
   at least one capacitor connection device;
   a cooling section of said at least one capacitor connection device is in a thermally conducting contact with a cooling surface of the cooling device;
   wherein each said capacitor connection device is designed as two flat metallic shaped bodies each with one respective contact device, and each having a connecting section between the capacitor device and the respective contact device;
   wherein the cooling section is a cooling extension, which is an integral part of the connecting section and does not contribute to the current-carrying capacity of the capacitor connection device;
   a profile of the connecting section has at least one slanted portion; and
   wherein said cooling extension, further comprises:
      said slanted portion extending to said cooling extension that is an unslanted portion of the respective connecting section.

2. The power electronics system, according to claim 1, wherein:
   the cooling device is an integral part of the housing or is arranged in the housing.

3. The power electronics system, according to claim 1, wherein:
   wherein the cooling surface is arranged on a pedestal or in a recess.

4. The power electronics system, according to claim 1, wherein:
   the cooling section is designed as an arrangement being at least one of a fan-shaped, a finger-shaped, and a mixed form of the fan-shaped and finger-shaped arrangement.

5. The power electronics system, according to claim 1, wherein:
   the connecting sections of one of the capacitor connection devices are arranged in stacks and run parallel to each other, and wherein an insulating material, preferably an insulating foil, is arranged between the connecting sections.

6. The power electronics system, according to claim 5, wherein:
   in a first configuration the cooling extension protrudes laterally from the connecting section.

7. The power electronics system, according to claim 1, wherein:

the cooling section is arranged in a region of a U-shaped folded section of the respective said connecting section.

8. The power electronics system, according to claim 1, wherein:

the cooling device is designed as a liquid cooling device with an inlet and an outlet device, or as an air cooling device.

\* \* \* \* \*

UNITED STATES PATENT AND TRADEMARK OFFICE
CERTIFICATE OF CORRECTION

PATENT NO. : 11,259,448 B2
APPLICATION NO. : 16/952445
DATED : February 22, 2022
INVENTOR(S) : Bittner et al.

Page 1 of 1

It is certified that error appears in the above-identified patent and that said Letters Patent is hereby corrected as shown below:

On the Title Page

Insert item (30), Foreign Application Priority Data:
-- December 17, 2019 (DE)......................... 10 2019 134 650.9 --

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*